US007816669B1

(12) United States Patent
Nauka (10) Patent No.: US 7,816,669 B1
(45) Date of Patent: Oct. 19, 2010

(54) LIGHT EMITTING SYSTEM AND METHODS FOR CONTROLLING NANOCRYSTAL DISTRIBUTION THEREIN

(75) Inventor: Krzysztof Nauka, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 27 days.

(21) Appl. No.: 11/581,018

(22) Filed: Oct. 13, 2006

(51) Int. Cl.
*H01L 35/24* (2006.01)

(52) U.S. Cl. .......... 257/40; 257/E51.018; 257/E51.033; 257/E51.034; 257/E51.035; 257/E51.036

(58) Field of Classification Search ............. 257/40, 257/E51.018, E51.033–E51.036
See application file for complete search history.

(56) References Cited

U.S. PATENT DOCUMENTS

| | | | |
|---|---|---|---|
| 6,501,091 B1 * | 12/2002 | Bawendi et al. .............. 257/14 |
| 6,580,545 B2 | 6/2003 | Morrison et al. |
| 6,727,065 B2 | 4/2004 | Weiss et al. |
| 6,777,706 B1 | 8/2004 | Tessler et al. |
| 6,846,565 B2 | 1/2005 | Korgel et al. |
| 6,918,946 B2 | 7/2005 | Korgel et al. |
| 6,949,206 B2 | 9/2005 | Whiteford et al. |
| 2003/0099968 A1 | 5/2003 | Weiss et al. |
| 2003/0189749 A1 | 10/2003 | Morrison et al. |
| 2005/0109989 A1 | 5/2005 | Whiteford et al. |
| 2005/0205849 A1 | 9/2005 | Whiteford et al. |
| 2005/0205850 A1 | 9/2005 | Whiteford et al. |
| 2005/0236556 A1 | 10/2005 | Sargent et al. |
| 2005/0266697 A1 | 12/2005 | Korgel et al. |
| 2005/0267345 A1 | 12/2005 | Korgel et al. |
| 2007/0096078 A1 * | 5/2007 | Lee et al. ..................... 257/14 |

OTHER PUBLICATIONS

Zhai, regioregular polythiophene/gold nanoparticle bybrid materials, J. Mater. Chem. 14, 141-143, 2004.*
Gaponik, A light-emitting device based on a CdTe nanocrystal/polyaniline composite, PCCP 1, 1999, pp. 1787-1789.*
Reghu, Superlocalization of the Electronic Wave Functions in Conductive Polymer Blends at Concentrations near the Percolation Threshold, Macromolecules 26, 1993, pp. 7245-7249.*
Zhao, Slip at polymer—polymer interfaces: Rheological measurements on coextruded multilayers, The Society of Rheology 46, 2002, pp. 145-167.*
Granstrom, White light emission from a polymer blend light emitting diode (Appl. Phys. Lett. 68, 147-149, 1995).*
Narayan, Dual function hybrid polymer-nanoparticle devices (Appl. Phys. Lett. 74, 871-873, 1999).*
Kucur et al. "Charge Transfer Efficiency in Hybrid Bulk Heterojunction Composites", Journal of Chemical Physics, vol. 121, No. 2, Jul. 8, 2004, pp. 1074-1079.
Dabbousi et al. "Electroluminescence From CdSe Quantum-Dot/Polymer Composites", Appl. Phys. Lett. 66 (11), Mar. 13, 1995, pp. 1316-1318.

(Continued)

*Primary Examiner*—Kiesha R Bryant
*Assistant Examiner*—Minchul Yang (57) ABSTRACT

A light emitting system includes a polymer mixture, and a plurality of nanocrystals occupying a predetermined portion of the polymer mixture. The polymer mixture includes at least two polymers that phase-segregate. Method(s) for controlling nanocrystal distribution within the light emitting device are also disclosed.

15 Claims, 4 Drawing Sheets

OTHER PUBLICATIONS

Greenham et al."Charge Sep & Trans in Conjugated-Polymer/Semiconductor-Nanocrystal Comp Studied by Photolumin Quenching & Photoconduct",PhysRevB,vol. 54,No. 24,pp. 17628-17637, Dec. 15, 1996.

Crooker et al."Spectrally Resolved Dynamics of Energy Trans in Quantum-Dot Assem:Towards Eng Energy Flows in Artificial Mat", Phys Rev Ltrs,vol. 89,No. 18,pp. 186802-1-186802-4, Oct. 28, 2002.

Basko et al. "Energy Transfer From a Semiconductor Quantum Dot to An Organic Matrix", Eur. Phys. J. B. 13, (2000), pp. 653-659.

* cited by examiner

LIGHT EMITTING SYSTEM AND METHODS FOR CONTROLLING NANOCRYSTAL DISTRIBUTION THEREIN

BACKGROUND

The present disclosure relates generally to light emitting systems and methods for controlling nanocrystal distribution therein.

Hybrid light emitting systems combine inorganic nanocrystals and organic molecules. Such systems often include the organic polymer with the inorganic nanocrystals incorporated therein. The organic polymer/inorganic nanocrystal layer may be one of many stacked layers in such systems. Some light generation mechanisms are more efficient when the nanocrystals are present at specific location(s) within the layer. As an example, one mechanism may be more efficient when the nanocrystals are placed in the vicinity of one or both of organic excitons or exciplexes, while another mechanism may be more efficient when the nanocrystals are uniformly dispersed within the interfacial plane separating two organic layers. Inorganic nanocrystal and organic polymer systems tend to minimize their energy by redistributing the nanocrystals in a manner favorable for thermodynamic stability and potentially deleterious to hybrid device performance. As a result, nanocrystals tend to phase-segregate to the surfaces of the polymer layer, to form large aggregates within the polymer layer, or combinations thereof. Redistribution of nanocrystals after phase segregation or aggregation may not only reduce their ability to emit light, but it may also, in some instances, degrade the quality of the polymer.

Further, the polymer layer surface in light emitting systems often forms an interface with a metal established adjacent thereto. Segregation of nanocrystals to the polymer-metal interface may result in a parasitic energy loss mechanism, where the excited nanocrystal transfers its energy to the metal polarons before its radiative relaxation (and light emission) occurs. Nanocrystals at the polymer layer surface may also be removed or damaged as the subsequent layer (e.g., metal) is established on the polymer.

Attempts to reduce nanocrystal phase segregation include controlled removal of solvent from the polymer/nanocrystal layer, inhibiting nanocrystal movement via polymer structure, incorporating nanocrystal ligands that may improve the miscibility of the nanocrystals within the polymer layer, altering processing conditions, and forming chemical bonds between the nanocrystals and the polymers. The application and effectiveness of such techniques may undesirably be limited to specific nanocrystal concentrations and/or the polymer-nanocrystal combination.

BRIEF DESCRIPTION OF THE DRAWINGS

Features and advantages of embodiments of the present disclosure will become apparent by reference to the following detailed description and drawings, in which like reference numerals correspond to similar, though not necessarily identical components. For the sake of brevity, reference numerals or features having a previously described function may not necessarily be described in connection with other drawings in which they appear.

DETAILED DESCRIPTION

Embodiments of the method disclosed herein include controlling the distribution of nanocrystals within a mixture of polymers by employing non-miscible or partially miscible polymers. The method(s) disclosed herein advantageously allow nanocrystals to be segregated at an interface or throughout the polymer(s), and in the vicinity of excitons, exciplexes, or combinations thereof. Such nanocrystal segregation may be accomplished in polymer mixtures having a sufficient amount of nanocrystals to obtain relatively high intensity and light emission. Still further, embodiment(s) of the method advantageously segregate nanocrystals substantially without the formation of densely packed nanocrystals near the polymer mixture surface.

Figure 1:
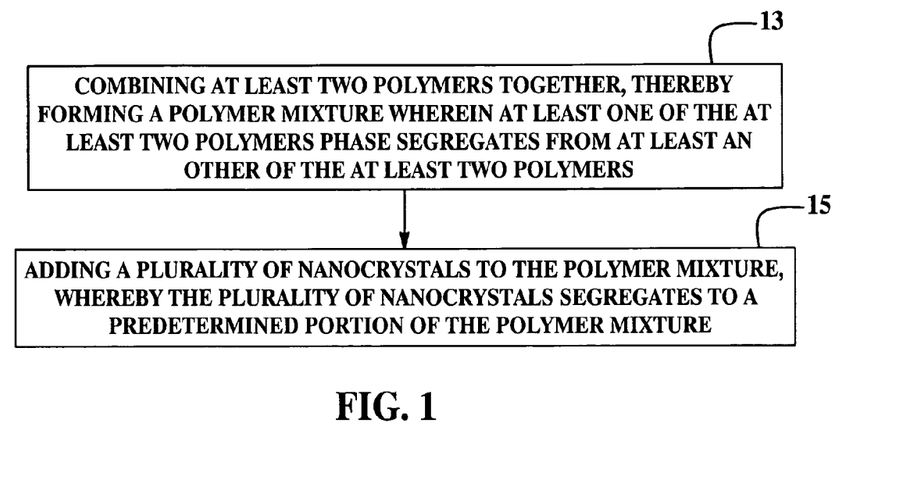
FIG. 1 is a flow diagram depicting an embodiment of the method for controlling nanocrystal distribution within a light emitting system.

FIG. 1 depicts an embodiment of a method of controlling the nanocrystal distribution within a light emitting system. Generally, the method includes combining at least two polymers together to form a polymer mixture, as shown at reference numeral 13; and adding a plurality of nanocrystals to the polymer mixture, as shown at reference numeral 15. The distribution of the nanocrystal(s) throughout the polymer mixture may be controlled so that the nanocrystal(s) occupy predefined, discrete portions of the polymer mixture. The mixture includes at least two partially miscible or non-miscible polymers. Examples of polymers that phase segregate include, but are not limited to poly(9,9'-dioctylfluorene (PFO) mixed with poly(dioctylfluorene-alt-benzothiadiazole (F8BT), polyaniline (PANI) mixed with poly methylmethacrylate (PMMA). It is to be understood that these examples are non-limiting, and that other partially miscible or non-miscible polymer mixtures are contemplated as being within the purview of this invention.

Figure 2:
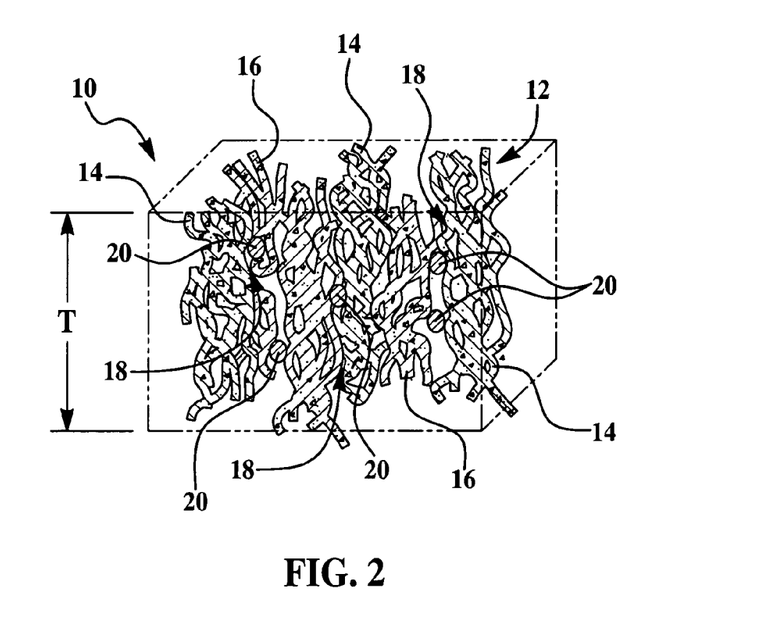
FIG. 2 is semi-schematic perspective view of an embodiment of a light emitting system.

Referring now to FIG. 2, an embodiment of the light emitting system 10 is depicted. This embodiment of the light emitting system 10 includes a mixture 12 of polymers 14, 16, and a plurality of nanoparticles 20.

In this embodiment, the properties and amounts of the polymers 14, 16 are selected so that when mixed and phase separated they form an interpenetrating network of polymers 14, 16. It is to be understood that at least one of the polymers 14, 16 is an electrical charge-conducting polymer. In an embodiment, one of the polymers 14, 16 conducts both electrons and holes. In another embodiment, each of the polymers 14, 16 is an electrical charge-conducting polymer. As a non-limiting example, one of the polymers 14, 16 conducts electrons, and the other of the polymers 16, 14 conducts holes.

It is believed that when the highest occupied molecular orbital (HOMO) and the lowest occupied molecular orbital (LUMO) levels of the two polymers 14, 16 are selected, the polymer mixture 12 provides a network in which polymer excitons, exciplexes, or combinations thereof may be created when injected carriers, e.g., an electrical current, are added to the system 10. In an embodiment, the polymer excitons and exciplexes are formed in the vicinity of interface(s) 18 between the two polymers 14, 16. Generally, the interface 18 is a surface that forms a common boundary between the two polymers 14, 16. It is believed that the three-dimensional nature of the interpenetrating network allows multiple interface(s) 18, thereby allowing excitons, exciplexes, or combinations thereof to be formed throughout substantially the entire volume of the polymer mixture 12.

The polymer mixture 12 may also include more than two polymers. In an embodiment, additional polymers may act as a scaffold in which the polymers 14, 16 may be mixed. In another embodiment, the additional polymers may be used to increase or decrease the degree of phase separation between the polymers 14, 16. In still another embodiment, the additional polymers may be used to adjust potential barriers between the polymers 14, 16 to enhance device performance.

In an embodiment, the polymer mixture 12 may be formed by dissolving the polymers 14, 16 in a solvent, and establishing the polymer/solvent solution on a substrate. In another embodiment, the polymers 14, 16 are established on a substrate, and then solvent is added, causing the polymers 14, 16 to dissolve to form the polymer/solvent solution. It is to be understood that establishing the separate components (i.e., polymers 14, 16 and then solvent) or the solution may be accomplished via any suitable method, non-limiting examples of which include spin-casting (e.g., for coating substantially the entire substrate), printing or stamping (e.g., for placing the polymer/solvent solution at desirable areas of the substrate), or the like, or combinations thereof. Prior to establishment of the polymers 14, 16 and solvent, nanocrystals 20 may also be added to the polymer/solvent solution or to the polymers 14, 16 prior to solution formation. In an embodiment, exposure to heat, solvent removal, or any other suitable method initiates the desired phase separation (non-limiting examples of which include the interpenetrating polymer network shown in FIG. 2, and the embodiments shown in FIGS. 6A and 6B).

Suitable solvents include, but are not limited to a variety of organic solvents having a polarity that provides the ability to dissolve the polymers 14, 16 while simultaneously rendering the desired behavior of the nanocrystals 20 within the solution.

In the embodiments disclosed herein, the miscibility of the nanocrystals 20 in the polymer mixture 12 depends, at least in part, on the surface chemistry of the nanocrystals 20. The nanocystals 20 may include an inorganic core within which light generation processes take place. The nanocrystals 20 may also include an inorganic core with an inorganic shell covering the core. The inorganic core (e.g., in an embodiment when the nanocrystal 20 has no shell), or shell (e.g., in an embodiment when the nanocrystal 20 has a shell) may be coated with a layer of organic molecules, such as, for example, organic ligands. The ligands control interactions between the nanocrystals 20 and their surrounding environment, and they determine to what degree the nanocrystals 20 are miscible in a polymer. It is to be understood that the ligands may also impact the nanocrystal's ability to emit light.

Figure 3:
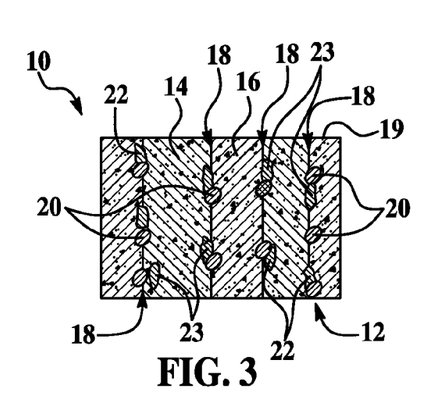
FIG. 3 is a schematic cross-sectional view of an embodiment of an interpenetrating polymer network having nanocrystals segregated towards an interface between the polymers.
Figure 4:
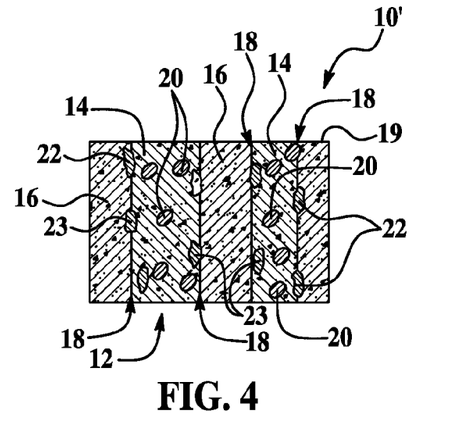
FIG. 4 is a schematic cross-sectional view of an embodiment of an interpenetrating polymer network having nanocrystals within one of the polymers.
Figure 5:
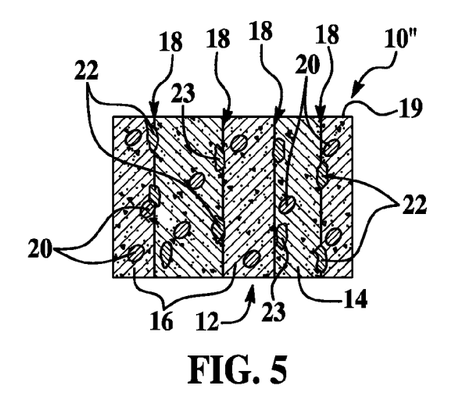
FIG. 5 is a schematic cross-sectional view of an embodiment of an interpenetrating polymer network having nanocrystals within both polymers.

FIGS. 3, 4 and 5 depict various cross-sections of light emitting systems 10 including the interpenetrating polymer mixture 12 and nanocrystals 20 occupying predetermined portions of the polymer mixture 12. The figures also depict the formation of excitons 22, exciplexes 23, or combinations thereof.

Specifically referring to FIG. 3, the interpenetrating polymer mixture 12 has nanocrystals 20 occupying portions of the interface(s) 18 between the two polymers 14, 16. In this embodiment, the nanocrystals 20 are not miscible in either of the polymers 14, 16, and therefore they segregate toward nearby interfaces 18, which provide low surface energy locations, rather than toward a surface 19 of the polymer mixture 12.

The embodiment shown in FIG. 3 also depicts excitons 22 and exciplexes 23, which singly or in combination are formed during operation of the system 10 or of a device incorporating the system 10 (e.g., when current is passed through the system 10). In this embodiment, it is to be understood that the nanocrystals 20 will remain within the general vicinity of the formed excitons 22 and exciplexes 23.

FIG. 4 depicts another embodiment of the light emitting system 10'. In this embodiment, the interpenetrating polymer mixture 12 has nanocrystals 20 occupying the polymers 14, 16. In this embodiment, the nanocrystals 20 are selected so that they are miscible in one of the two polymers 14, 16. As such, the nanocrystals 20 will segregate to that particular polymer 14, 16. While FIG. 4 depicts the nanocrystals 20 being miscible in the polymer 14, it is to be understood that the nanocrystals 20 may be selected to be miscible in the polymer 16.

In this embodiment, the average cross-section of the polymer 14, 16 having the nanocrystal(s) 20 miscible therein is relatively small (i.e., on the order of tens of nanometers). Without being bound to any theory, it is believed that this allows a majority of the nanocrystal(s) in the polymer 14, 16 to be within the diffusion range of the excitons 22, exciplexes 23, or combinations thereof formed at the interface(s) 18 when the system 10' is in operation. As previously described, excitons 22, exciplexes 23, or combinations thereof are formed when current is passed through the system 10'.

FIG. 5 depicts still another embodiment of the light emitting system 10". In this embodiment, the interpenetrating polymer mixture 12 has nanocrystals 20 occupying both the polymers 14, 16. In this embodiment, the nanocrystals 20 are selected so that they are miscible in both of the polymers 14, 16. As such, the nanocrystals 20 will generally not phase segregate, rather they will remain within the polymers 14, 16.

In the embodiment depicted in FIG. 5, the average cross-sections of particular segments of the polymers 14, 16 are relatively small (i.e., on the order of tens of nanometers). Without being bound to any theory, it is believed that this allows a majority of the nanocrystals 20 in the polymers 14, 16 to be within the diffusion range of the excitons 22, exciplexes 23, or combinations thereof formed at the interface(s) 18 when the system 10" (or device in which the system 10" is included) is in operation.

It is to be understood that other variations (beyond those shown in FIGS. 2-5) of the nanocrystal 20 distributions within the light emitting system 10, 10', 10" are possible. A non-limiting example of such a variation includes a gradient of nanocrystal(s) 20 formed in at least one of the electron- or hole-conducting polymers 14, 16 toward the interface(s) 18. A gradient may be formed by using nanocrystals 20 that are partially miscible within one or both of the polymers 14, 16. Partial segregation may also be achieved by using a mixture of two types of nanocrystals 20, one of which is miscible in the polymer(s) 14, 16, and the other of which is not miscible in the polymer(s) 14, 16. As a non-limiting example, partial segregation is accomplished using some nanocrystals 20 having ligands that favor phase segregation attached to the surface, and other nanocrystals 20 having ligands that favor mixing attached to the surface. Another non-limiting example of such a variation includes chemically bonding the nanocrystal(s) 20 to one or more of the polymers 14, 16.

As previously described, the interpenetrating polymer mixture 12 (shown in FIGS. 2-5) includes multiple interfaces 18 between the polymers 14, 16. It is believed that the multiplicity of sides of interface 18 allows nanocrystals 20 to be distributed throughout the volume of the polymer mixture 12. The thickness T (shown in FIG. 1) of the polymer mixture 12 may be relatively large, as the thickness T is limited by the resistance of the polymer 14, 16. In an embodiment, the thickness T of the polymer mixture 12 ranges from about 10 nm to about 1000 nm. The thickness T enables a relatively large number of nanocrystals 20 to be distributed throughout the polymer mixture 12. Embodiments of the light emitting system(s) 10, 10', 10" may advantageously achieve a relatively high emission intensity. This is due, at least in part, to the large number of nanocrystals 20 that may be included in the mixture 12 without overcrowding (which otherwise may lead to polymer degradation), maintaining an average distance between the nanocrystals 20 (thereby substantially avoiding deleterious nanocrystal-nanocrystal interaction), or combinations thereof.

Figure 6A:
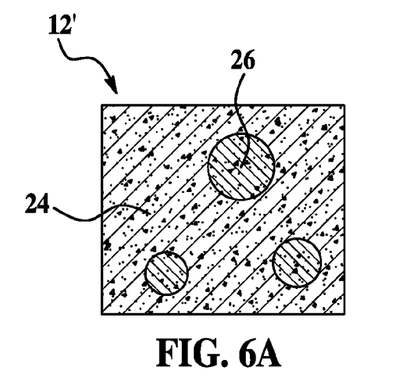
FIGS. 6A and 6B are schematic cross-sectional views of embodiments of a polymer mixture phase separated via nucleation and growth, and spinoidal decomposition, respectively.
Figure 6B:
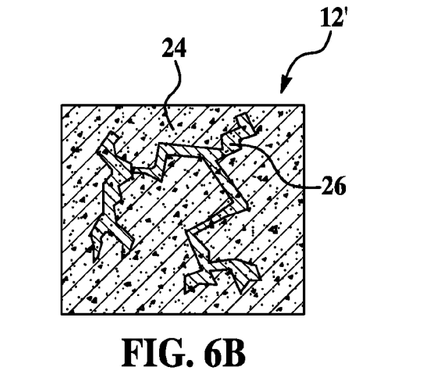

Referring now to FIGS. 6A and 6B, other embodiments of the polymer mixture 12' are depicted. Specifically, FIG. 6A shows polymer 26 phase segregated from polymer 24 via a nucleation and growth mechanism; and FIG. 6B shows polymer 26 phase segregated from polymer 24 via spinoidal decomposition. The different methods used may generally contribute to the different configuration (e.g., size, shape, etc.) of the phase segregated polymer 26.

In these embodiments, the polymer mixture 12' includes uneven amounts of two polymers 24, 26. The polymers 24, 26 are partially or fully non-miscible, and tend to phase segregate. Generally, the polymer 26, 24 that separates is incorporated in smaller amounts than the polymer 24, 26 that acts as the matrix for the segregated polymer 26, 24. As shown in FIGS. 6A and 6B, if the mixture 12' contains larger amounts of the polymer 24, the polymer 26 separates to form inclusions of the polymer 26 within the polymer 24. It is to be understood, however, that the amount of polymer 24 may be selected so that it forms inclusions within polymer 26. As used herein, the larger amount of polymer (e.g., polymer 24) is referred to as the "polymer matrix", while the smaller amount of polymer (e.g., polymer 26) is referred to as the "polymer inclusions".

Generally, the phase segregated polymer inclusions (shown as 26) have an arbitrary size (e.g., ranging from nanometers to microns). It is to be understood that additional polymers may be added to the mixture 12' to assist in controlling the size and shape of the inclusions 26 in the matrix 24.

Figure 7A:
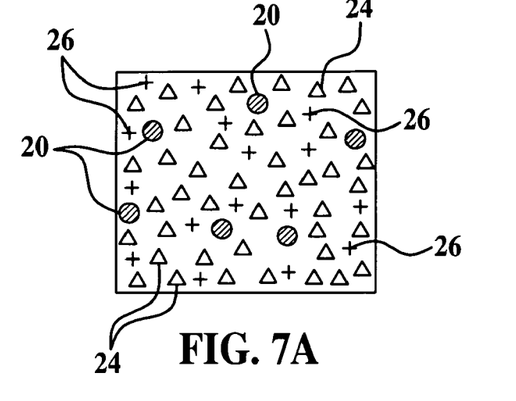
FIGS. 7A through 7C schematically depict an embodiment of the method for controlling nanocrystal segregation in a phase separated polymer mixture.
Figure 7B:
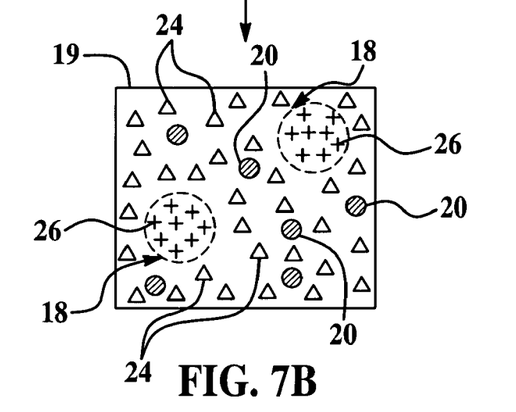
Figure 7C:
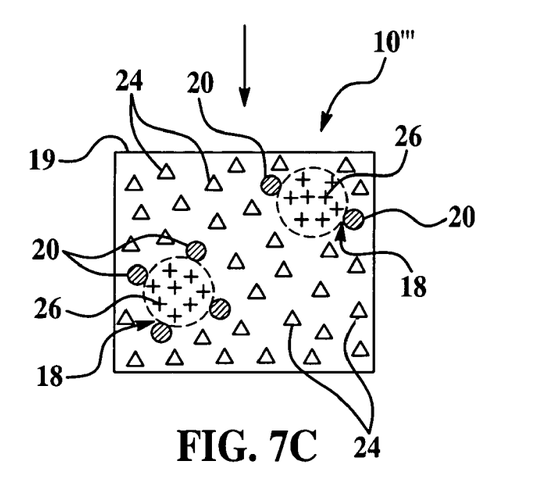

In an embodiment, the polymer matrix 24 may be the nanocrystal 20 bearing component of the light emitting system 10''' (shown in FIG. 7C). As such, light generation may be contingent upon placing the nanocrystals 20 at specific locations within the polymer matrix 24.

Polymer phase segregation may be accomplished via nucleation and growth (FIG. 6A) or via spinoidal decomposition (FIG. 6B). It is to be understood that the mechanism (i.e., whereby segregation occurs in the mixture 12) of polymer phase segregation may be determined, at least in part, by the polymers 24, 26 selected, the solvent removal conditions, the desirable shape of the polymer 26 inclusions, or the like, or combinations thereof.

FIGS. 7A through 7C illustrate an embodiment of forming an embodiment of a light emitting system 10''' having the polymer mixture 12' and nanocrystals 20 therein. It is to be understood that the phase segregated polymer mixture 12' (shown in FIGS. 6A and 6B) advantageously allows for the distribution of the nanocrystals 20 at the interfaces 18 between polymer matrix 24 and polymer inclusions 26. It is to be further understood that the distribution of nanocrystals 20 follows the distribution of the polymer inclusions 26 within polymer matrix 24.

FIG. 7A depicts the mixture of a larger amount of polymer 24 (represented by triangles), a smaller amount of polymer 26 (represented by crosses), and the nanocrystal(s) 20 (represented by circles) within a suitable solvent (not shown). Suitable solvents include, but are not limited to a variety of organic solvents having a polarity that provides the ability to dissolve the polymers 24, 26 while simultaneously rendering the desired behavior of the nanocrystals 20 within the solution. As depicted in FIG. 7A, the polymers 24, 26 and the nanocrystal(s) 20 are randomly distributed throughout the solvent. While not shown, the polymer/nanocrystal/solvent mixture shown FIG. 7A may be established on a substrate (not shown) as a layer or film. Alternatively, the polymers 24, 26 and nanocrystals 20 may be established on the substrate and then have the solvent added thereto. In an embodiment, establishing, as previously described above in reference to FIG. 2, may be accomplished via spin-casting, printing, stamping, or the like, or combinations thereof.

FIG. 7B illustrates the mixture after the phase segregation process is initiated. As depicted, the polymer 26, 24 substantially immediately begins to phase segregate from the polymer 24, 26 to form the inclusions. It is to be understood that the concentration of the polymer 26, 24 and the solvent removal conditions may be selected so that the average size of the phase segregated polymer 26, 24 is relatively small, and the density is low enough to substantially not perturb the structural and electronic properties of the matrix polymer 24, 26.

The multiple interfaces 18 between the polymers 24, 26 provide low free energy sites within the polymer mixture 12'. At this stage (as depicted in FIG. 7B), the nanocrystals 20 are still capable of moving within mixture 12', while attempting to minimize their energy. Since the interfaces 18 at the polymer matrix 24—polymer inclusion 26 boundary are much closer than the surface 19 of polymer mixture 12', the majority of the nanocrystals 20 will remain within the bulk of the matrix 24 rather than aggregate at the surface 19 of the mixture 12'.

FIG. 7C depicts an embodiment of the light emitting system 10'' upon completion of phase segregation and nanocrystal 20 movement.

In the embodiment shown in FIGS. 6A, 6B and 7A through 7C, the phase segregating polymer 26, 24 may be selected so that it does not substantially impact and/or impede the electronic processes taking place within the system 10'''. Furthermore, the phase segregating polymer 26, 24 may be selected so that it enhances the electronic processes taking place within the system 10'''.

Figure 8A:
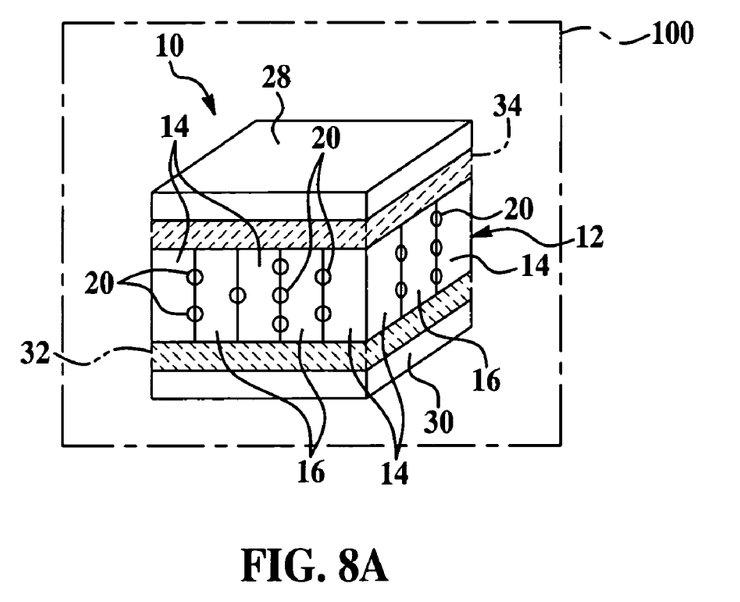
FIGS. 8A and 8B are semi-schematic perspective views of two embodiments of an emissive display device.
Figure 8B:
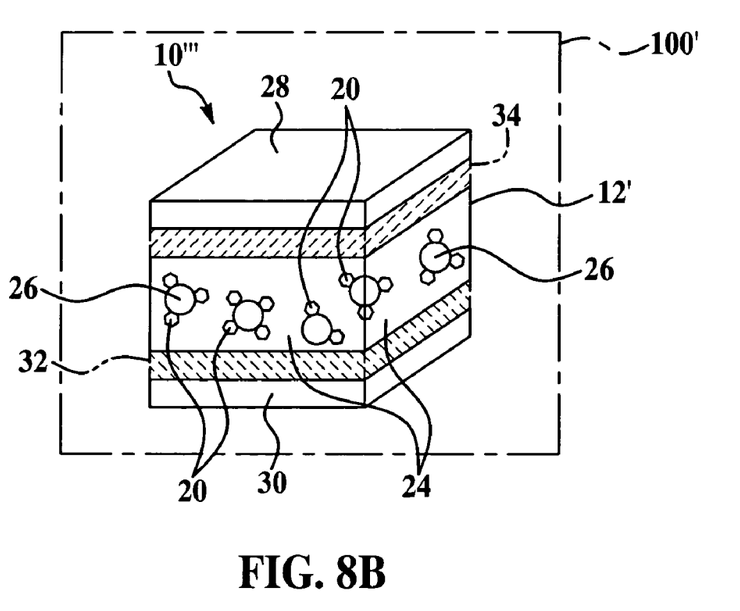

Referring now to FIGS. 8A and 8B, embodiments of the light emitting system 10, 10''' are shown incorporated into an emissive display device 100, 100', respectively. It is to be understood that the light emitting system 10, 10', 10", 10"' may be incorporated into any suitable display device 100, 100'.

As depicted, the light emitting system 10, 10', 10", 10'" may further include top and bottom electrodes 28, 30, for supplying current to the system 10, 10', 10", 10'". In an embodiment, the electrodes 28, 30 may include, but are not limited to metals (non-limitative examples of which include aluminum, barium, lithium, gold, platinum, or the like, or combinations thereof), doped non-metals, organic materials, inorganic materials (a non-limitative example of which includes indium tin oxide), conducting polymers, or combinations thereof.

As depicted in these figures, the light emitting system 10, 10', 10", 10'" may also include a blocking layer 32 between one of the electrodes 30, 28 and the polymer mixture 12, 12', and/or a blocking layer 34 between the other of the electrodes 28, 30 and the polymer mixture 12, 12'. It is to be understood that such blocking layers 32, 34 may be included to suppress parasitic leakage of currents(s) flowing throughout the polymer mixture 12, 12'.

Embodiments of the system 10, 10', 10", 10'" and method disclosed herein include, but are not limited to the following advantages. The distribution of nanocrystals 20 throughout the polymer mixture 12, 12' may be controlled, at least by the selection of polymers 14, 16, 24, 26, nanocrystals 20, solvent, or the like. The nanocrystals 20 advantageously segregate to predefined, discrete areas of the polymer mixture 12, 12' where they are in the vicinity of excitons 22, exciplexes 23, or combinations thereof formed during operation of the system 10, 10', 10", 10'".

While several embodiments have been described in detail, it will be apparent to those skilled in the art that the disclosed embodiments may be modified. Therefore, the foregoing description is to be considered exemplary rather than limiting.

What is claimed is:

1. A light emitting system, comprising:
   a polymer mixture including at least two partially miscible or non-miscible different polymers that segregate, the polymer mixture having a thickness ranging from about 10 nm to about 1000 nm; and
   a controlled distribution of a plurality of nanocrystals occupying predefined, discrete positions of the polymer mixture, the controlled distribution being achieved due to properties of the at least two partially miscible or non-miscible different polymers selected for the polymer mixture and properties of the plurality of nanocrystals selected for the polymer mixture.

2. The light emitting system as defined in claim 1 wherein the polymer mixture includes a three-dimensional interpenetrating network of the at least two partially miscible or non-miscible different polymers, and wherein at least one of the at least two partially miscible or non-miscible different polymers conducts electrical charge.

3. The light emitting system as defined in claim 2 wherein each of the at least two partially miscible or non-miscible different polymers conducts electrical charge, wherein one of the at least two partially miscible or non-miscible different polymers conducts electrons, and wherein an other of the at least two partially miscible or non-miscible different polymers conducts holes.

4. The light emitting system as defined in claim 2 wherein the nanocrystals are not miscible in either of the at least two partially miscible or non-miscible different polymers, and wherein the controlled distribution includes at least some of the plurality of nanocrystals being located at an interface between the at least two partially miscible or non-miscible different polymers because the plurality of nanocrystals are not miscible in either of the at least two partially miscible or non-miscible different polymers.

5. The light emitting system as defined in claim 2 wherein at least some of the plurality of nanocrystals are miscible in at least one of the at least two partially miscible or non-miscible different polymers.

6. The light emitting system as defined in claim 2 wherein the controlled distribution includes a gradient of the plurality of nanocrystals formed in at least one of the at least two partially miscible or non-miscible different polymers towards an interface between the at least two partially miscible or non-miscible different polymers.

7. The light emitting system as defined in claim 1 wherein the polymer mixture includes three-dimensional discrete inclusions of one of the at least two partially miscible or non-miscible different polymers in an other of the at least two partially miscible or non-miscible different polymers, and wherein the controlled distribution includes at least some of the plurality of nanocrystals located at an interface between the discrete inclusions and the other of the at least two partially miscible or non-miscible different polymers.

8. The light emitting system as defined in claim 1 wherein the controlled distribution includes the plurality of nanocrystals located within a diffusion range of at least one of excitons, exciplexes, or combinations thereof formed when current is passed through the system.

9. The light emitting system as defined in claim 8 wherein the at least one of excitons, exciplexes, or combinations thereof are formed in a vicinity of an interface between the at least two partially miscible or non-miscible different polymers throughout a volume of the polymer mixture.

10. The light emitting system as defined in claim 8 wherein the excitons, the exciplexes, or the combinations thereof are configured to transfer energy into at least one of the plurality of nanocrystals.

11. The light emitting system as defined in claim 1 wherein at least one of the at least two partially miscible or non-miscible different polymers conducts holes, wherein at least one other of the at least two partially miscible or non-miscible different polymers conducts electrons, and wherein the polymer mixture further includes a scaffold polymer, a polymer configured to increase or decrease segregation of the at least two partially miscible or non-miscible different polymers, or a polymer configured to adjust a potential barrier between the at least two partially miscible or non-miscible different polymers.

12. The light emitting system as defined in claim 1 wherein the polymer mixture includes three-dimensional discrete inclusions of one of the at least two partially miscible or non-miscible different polymers in an other of the at least two partially miscible or non-miscible different polymers, and wherein the plurality of nanocrystals are miscible in one or the other of the at least two partially miscible or non-miscible different polymers.

13. The light emitting system as defined in claim 1 wherein the polymer mixture includes three-dimensional discrete inclusions of one of the at least two partially miscible or non-miscible different polymers in an other of the at least two partially miscible or non-miscible different polymers, and wherein the controlled distribution includes a gradient of the plurality of nanocrystals formed in one or the other of the at least two partially miscible or non-miscible different polymers towards an interface between the inclusions and the other of the at least two partially miscible or non-miscible different polymers.

14. The light emitting system as defined in claim 1 wherein the controlled distribution includes each of the plurality of nanoparticles being positioned an average distance from each other to substantially avoid nanocrystal-nanocrystal interaction.

15. A light emitting system, comprising:
- a polymer mixture including at least two partially miscible or non-miscible different polymers that segregate, the polymer mixture having a thickness ranging from about 10 nm to about 1000 nm; and
- a controlled distribution of a plurality of nanocrystals occupying predefined, discrete positions of the polymer mixture, the controlled distribution being achieved due to properties of the at least two partially miscible or non-miscible different polymers selected for the polymer mixture
- wherein the controlled distribution includes the plurality of nanocrystals chemically bonded to at least one of the at least two partially miscible or non-miscible different polymers in the polymer mixture.

* * * * *